(12) United States Patent
Nakagawa et al.

(10) Patent No.: US 9,246,470 B2
(45) Date of Patent: Jan. 26, 2016

(54) VIBRATING ELEMENT, VIBRATOR, OSCILLATOR, ELECTRONIC APPARATUS, AND MOVING OBJECT

(71) Applicant: Seiko Epson Corporation, Tokyo (JP)

(72) Inventors: Keiji Nakagawa, Minowa (JP); Ryuta Nishizawa, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/522,961

(22) Filed: Oct. 24, 2014

(65) Prior Publication Data

US 2015/0116050 A1    Apr. 30, 2015

(30) Foreign Application Priority Data

Oct. 29, 2013 (JP) ................. 2013-224053

(51) Int. Cl.
*H03B 5/32* (2006.01)
*H03H 9/21* (2006.01)
*H03L 1/02* (2006.01)
*H03H 3/007* (2006.01)
*H03H 9/05* (2006.01)

(52) U.S. Cl.
CPC . *H03H 9/21* (2013.01); *H03B 5/32* (2013.01); *H03H 3/0076* (2013.01); *H03H 9/0542* (2013.01); *H03L 1/028* (2013.01)

(58) Field of Classification Search
CPC ......... G01C 19/5607; G01P 9/04; G04F 5/04; G04F 5/06; G04F 5/063; H03B 5/30; H03B 5/32; H03H 9/17; H03H 9/21; H03H 9/215; H03H 9/2468; H03H 9/2473; H03H 9/2478; H03H 9/2484; H03H 9/2489; H03H 9/2494; H03H 2003/026; H03H 2003/0492; H03L 1/02; H03L 1/028

USPC .......... 310/311, 312, 348, 370; 331/154, 156, 331/158, 176; 73/504.12, 504.16
See application file for complete search history.

(56) References Cited

U.S. PATENT DOCUMENTS

| | | | |
|---|---|---|---|
| 5,585,562 A * | 12/1996 | Kurata et al. ............... | 73/504.16 |
| 5,861,705 A * | 1/1999 | Wakatsuki et al. .......... | 310/370 |
| 7,207,221 B2 | 4/2007 | Kawauchi et al. | |
| 2005/0161749 A1* | 7/2005 | Yang et al. ................... | 257/414 |
| 2005/0206277 A1* | 9/2005 | Eguchi et al. ................ | 310/370 |
| 2009/0007665 A1* | 1/2009 | Kurakawa ................... | 73/504.16 |

(Continued)

FOREIGN PATENT DOCUMENTS

| | | |
|---|---|---|
| JP | 2006-105614 A | 4/2006 |
| JP | 2012-098091 A | 5/2012 |

*Primary Examiner* — Levi Gannon
(74) *Attorney, Agent, or Firm* — Harness, Dickey & Pierce, P.L.C.

(57) ABSTRACT

A vibrating element has a drive mode, and first and second detection modes in which the vibrating element vibrates in a direction orthogonal to a vibration direction in the drive mode. In frequency-temperature characteristic curves representing a change in frequency due to a change in temperature in the respective modes with a horizontal axis representing an ambient temperature and a vertical axis representing a change in frequency, when a turnover temperature of the frequency-temperature characteristic curve in the drive mode is Ta [° C.], a turnover temperature of the frequency-temperature characteristic curve in the first detection mode is Tb [° C.], and a turnover temperature of the frequency-temperature characteristic curve in the second detection mode is Tc [° C.], Ta is lower than Tb and Tc, or Ta is higher than Tb and Tc.

10 Claims, 16 Drawing Sheets

(56) References Cited

U.S. PATENT DOCUMENTS

| | | | |
|---|---|---|---|
| 2010/0116052 A1* | 5/2010 | Yanagisawa et al. | 73/504.16 |
| 2011/0210801 A1* | 9/2011 | Rottenberg et al. | 331/156 |
| 2012/0103095 A1 | 5/2012 | Wada et al. | |
| 2012/0216614 A1* | 8/2012 | Matsumoto et al. | 73/504.16 |
| 2014/0077664 A1* | 3/2014 | Ogura et al. | 310/370 |

* cited by examiner

VIBRATING ELEMENT, VIBRATOR, OSCILLATOR, ELECTRONIC APPARATUS, AND MOVING OBJECT

BACKGROUND

1. Technical Field

The present invention relates to a vibrating element, a vibrator, an oscillator, an electronic apparatus, and a moving object.

2. Related Art

As vibrating elements, for example, sensors that detect a physical quantity such as an angular velocity or an acceleration and are used for body control in vehicles, self-position detection of car navigation systems, vibration control correction (so-called camera-shake correction) for digital cameras or video camcorders, or the like have been known. As the sensors, for example, angular velocity sensors (vibration gyro sensors) have been known (for example, refer to JP-A-2006-105614).

For example, a vibration gyro sensor disclosed in JP-A-2006-105614 includes a base portion, coupling arms extended from the base portion, driving arms extended from the tips of the coupling arms, and detecting arms extended from the base portion. When an angular velocity in a predetermined direction is applied to the vibration gyro sensor in a state where the driving arms are flexurally vibrated, the Coriolis force acts on the driving arms, and consequently, the detecting arms flexurally vibrate. By detecting the flexural vibrations of the detecting arms, the angular velocity can be detected.

The base portion or driving arms of the vibration gyro sensor is formed of, for example, a piezoelectric material. By processing the piezoelectric material using a photolithographic technique or an etching technique, the base portion or driving arms is formed.

JP-A-2012-98091 discloses a piezoelectric vibration-type yaw rate sensor (vibrator) having a plurality of detection modes (first and second detection vibration modes). In the sensor, a resonance frequency in the first detection vibration mode is made close to a resonance frequency in the second detection vibration mode to increase amplitudes at the detecting arms, so that the sensitivity of the sensor is increased.

In the sensor (vibrator) disclosed in JP-A-2012-98091, a relationship with the frequency is described, but there is no consideration of a relationship between the temperature and the frequency. Therefore, it is difficult to suppress degradation in characteristics such as frequency characteristics due to a change in temperature.

SUMMARY

An advantage of some aspects of the invention is to provide a vibrating element and a vibrator capable of suppressing degradation in characteristics such as sensitivity associated with a change in frequency due to a change in temperature, and to provide an oscillator, an electronic apparatus, and a moving object having high reliability.

The invention can be implemented as the following application examples.

Application Example 1

This application example of the invention is directed to a vibrating element having a drive mode, and first and second detection modes in which the vibrating element vibrates in a direction orthogonal to a vibration direction in the drive mode, wherein in frequency-temperature characteristic curves representing a change in frequency due to a change in temperature in the respective modes with a horizontal axis representing an ambient temperature and a vertical axis representing a change in frequency, when a turnover temperature of the frequency-temperature characteristic curve in the drive mode is Ta [° C.], a turnover temperature of the frequency-temperature characteristic curve in the first detection mode is Tb [° C.], and a turnover temperature of the frequency-temperature characteristic curve in the second detection mode is Tc [° C.], the Ta is lower than the Tb and the Tc, or the Ta is higher than the Tb and the Tc.

According to the vibrating element, it is possible to suppress degradation in characteristics such as sensitivity associated with a change in frequency due to a change in temperature.

Application Example 2

This application example of the invention is directed to the vibrating element according to the application example described above, wherein when a resonance frequency in the drive mode is fa, a resonance frequency in the first detection mode is fb, and a resonance frequency in the second detection mode is fc, the fa falls between the fb and the fc.

With this configuration, it is possible to further improve sensitivity while suppressing degradation in characteristics such as sensitivity associated with a change in frequency due to a change in temperature.

Application Example 3

This application example of the invention is directed to the vibrating element according to this application example of the invention described above, which includes: a base portion; a pair of drive vibrating arms extended from the base portion; and a pair of detection vibrating arms extended from the base portion in a direction opposite to the pair of drive vibrating arms.

With this configuration, it is possible to provide the H-shaped vibrating element having high reliability in which degradation in characteristics such as sensitivity associated with a change in frequency due to a change in temperature is suppressed.

Application Example 4

This application example of the invention is directed to a vibrator including: the vibrating element according to the application example described above; and a package in which the vibrating element is accommodated.

With this configuration, it is possible to provide the vibrator having excellent vibration characteristics.

Application Example 5

This application example of the invention is directed to an oscillator including: the vibrating element according to the application example described above; and an oscillation circuit electrically connected to the vibrating element.

With this configuration, it is possible to provide the oscillator having high reliability.

Application Example 6

This application example of the invention is directed to an electronic apparatus including the vibrating element according to the application example described above.

With this configuration, it is possible to provide the electronic apparatus having high reliability.

Application Example 7

This application example of the invention is directed to a moving object including the vibrating element according to the application example described above.

With this configuration, it is possible to provide the moving object having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail based on preferred embodiments shown in the accompanying drawings.

Oscillator

An oscillator including an embodiment of a vibrator element according to the invention will be described.

Figure 1:
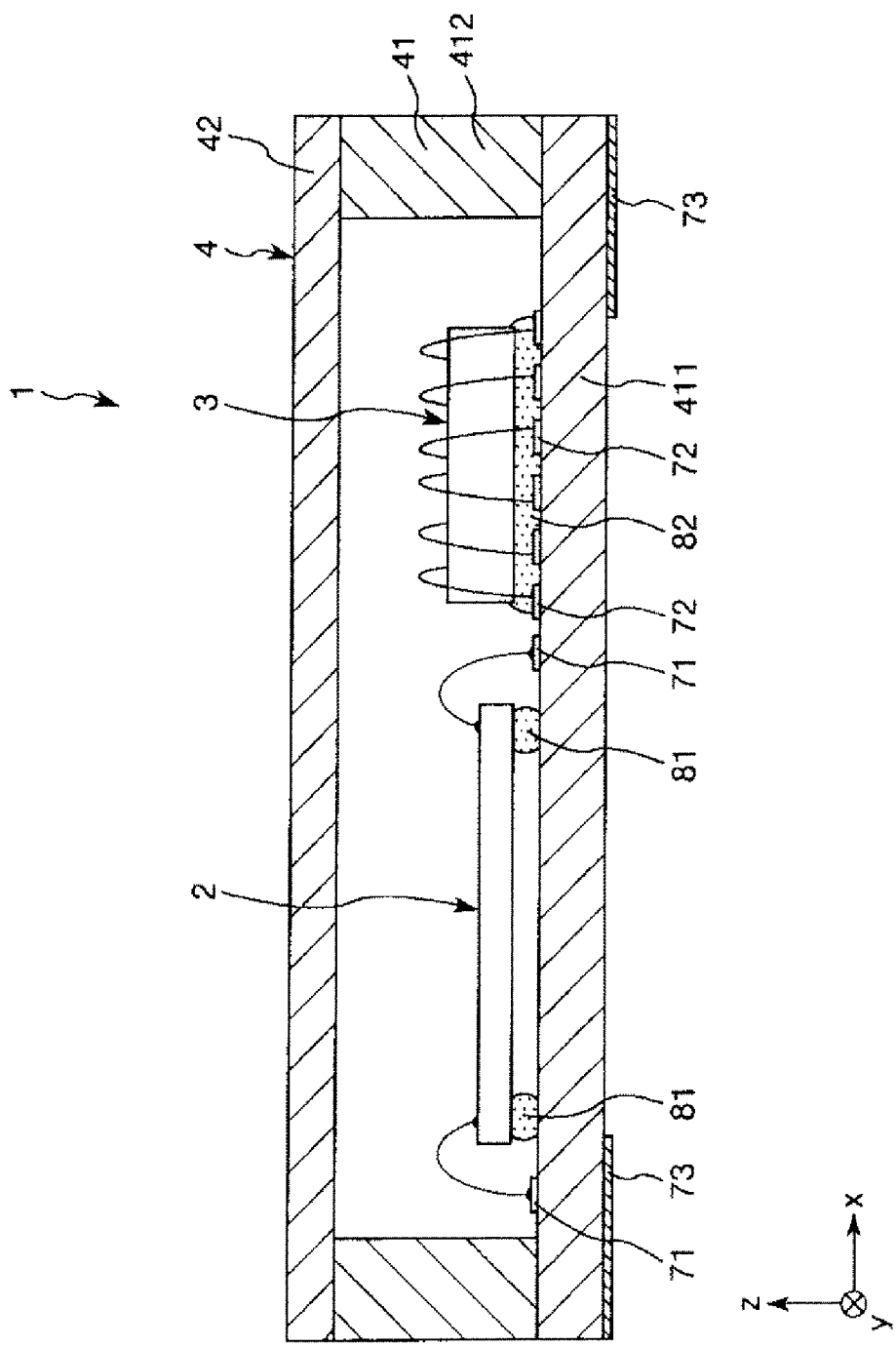
FIG. 1 is a schematic cross-sectional view showing a schematic configuration of an oscillator including an embodiment of a vibrating element according to the invention.
Figure 2:
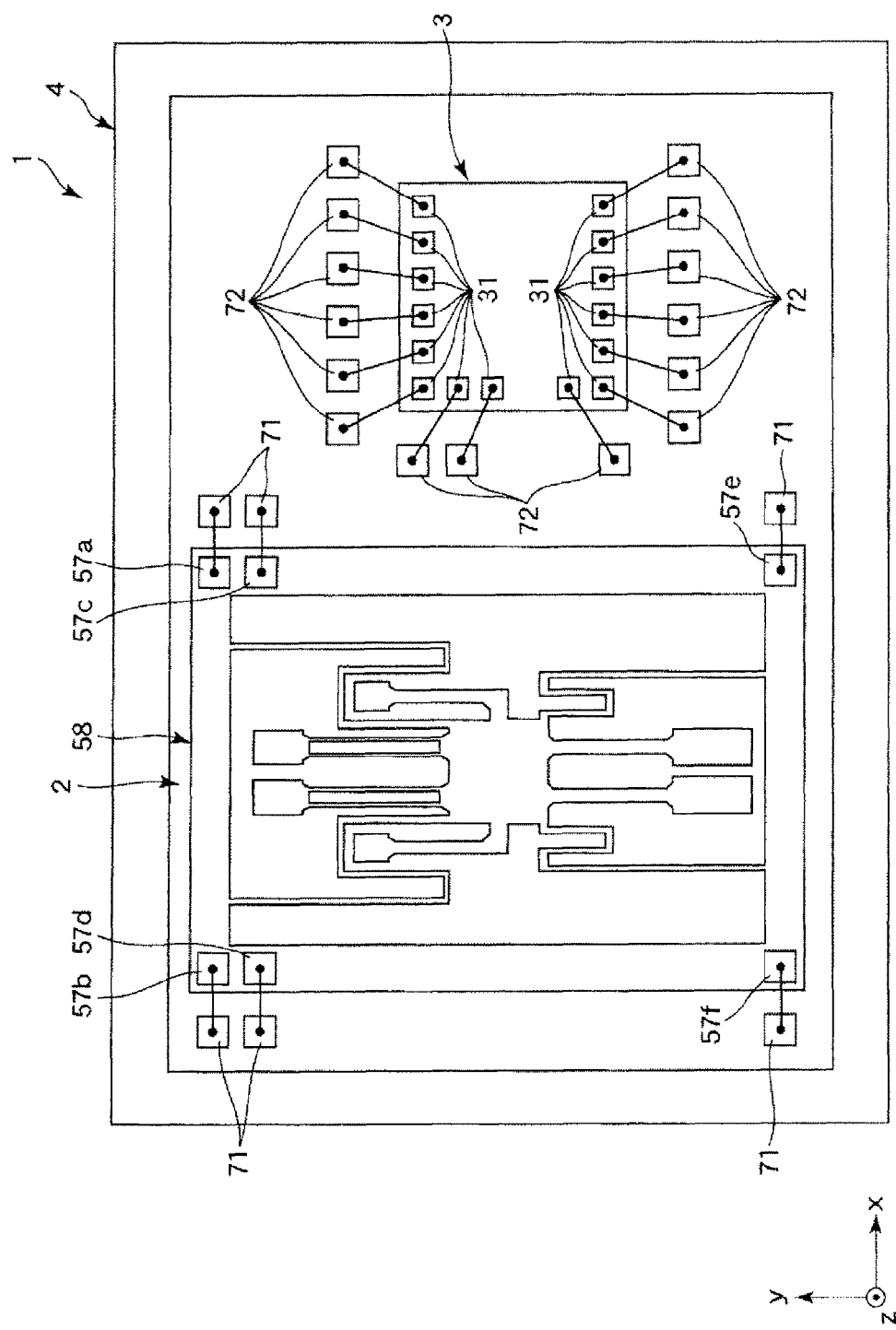
FIG. 2 is a plan view of the oscillator shown in FIG. 1.
Figure 3:
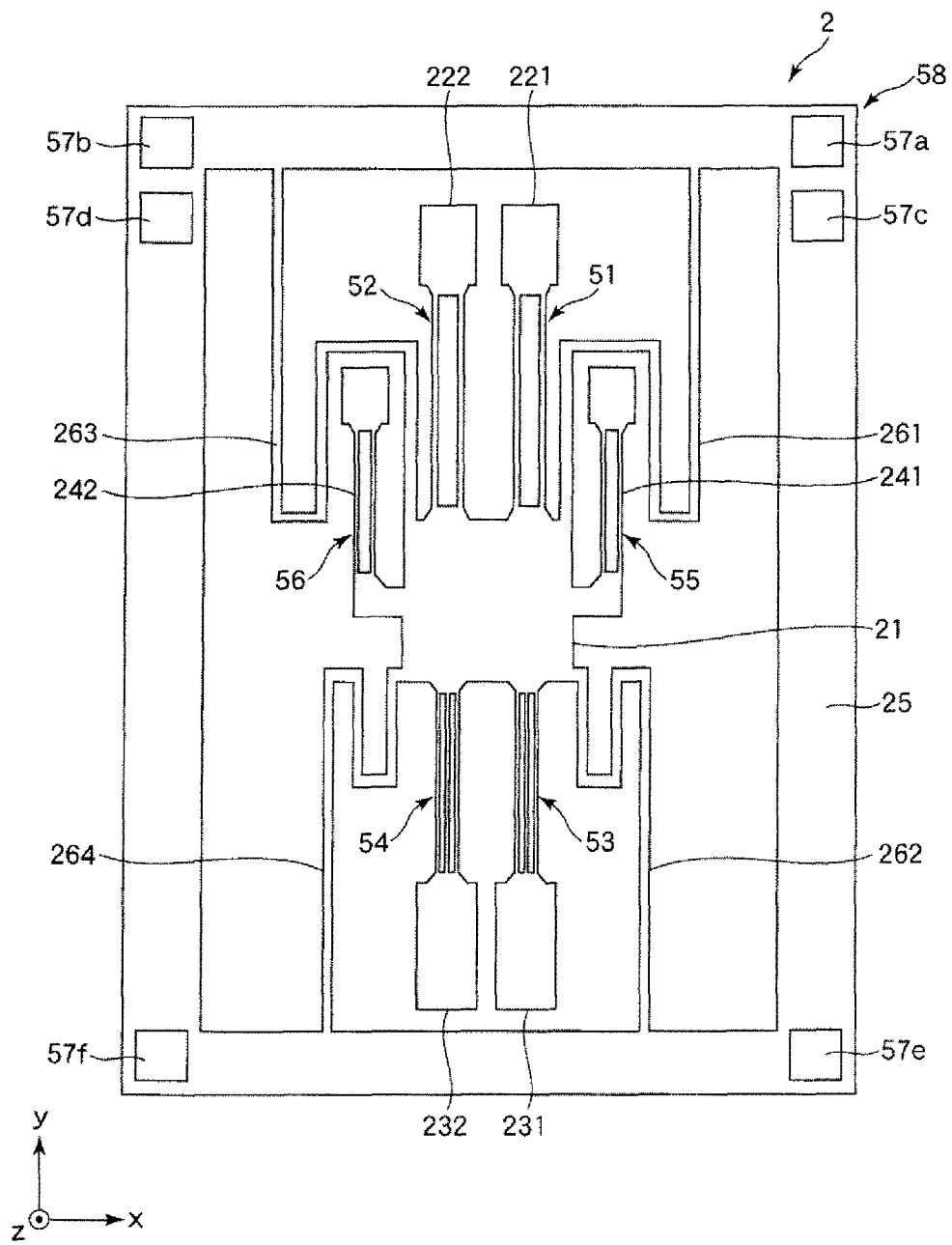
FIG. 3 is a plan view showing the vibrating element included in the oscillator shown in FIG. 1.
Figure 4A:
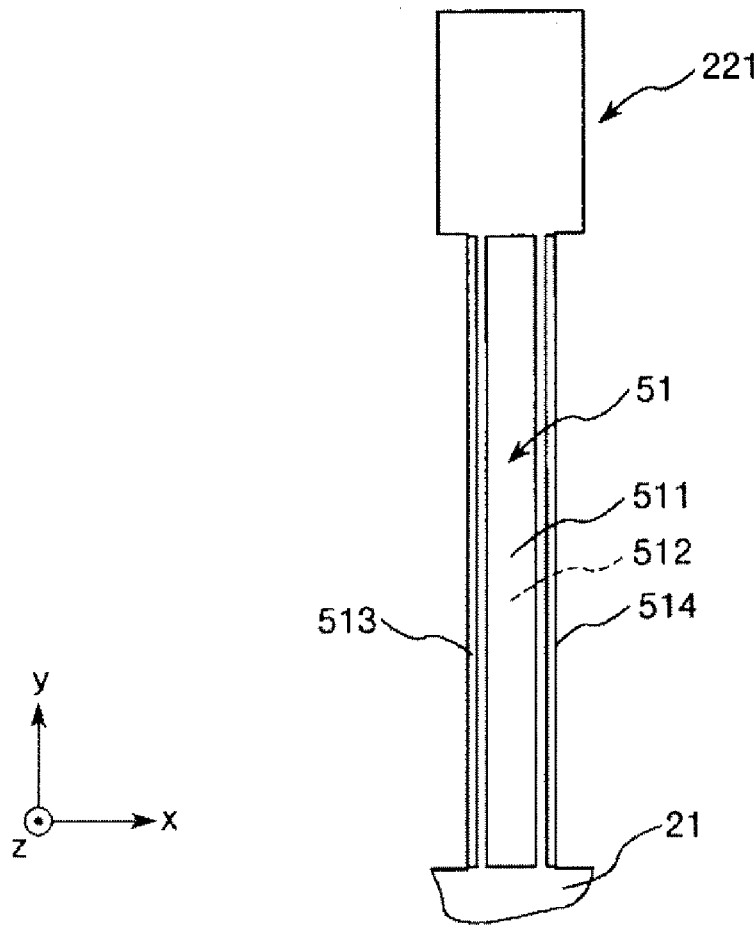
FIG. 4A is an enlarged plan view of a drive vibrating arm of the vibrating element shown in FIG. 3.
Figure 4B:
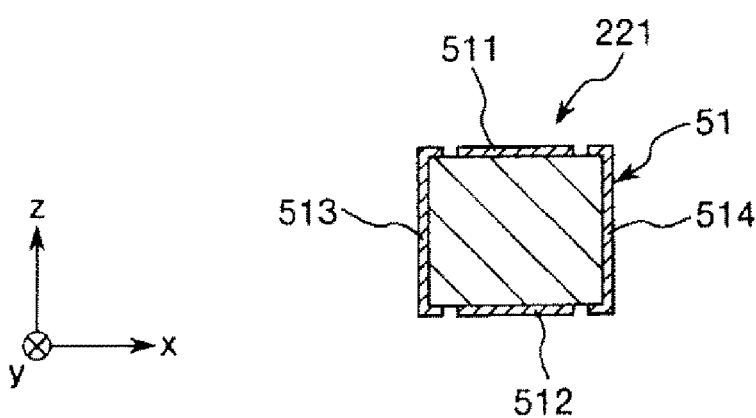
FIG. 4B is a cross-sectional view of the drive vibrating arm shown in FIG. 4A.
Figure 5A:
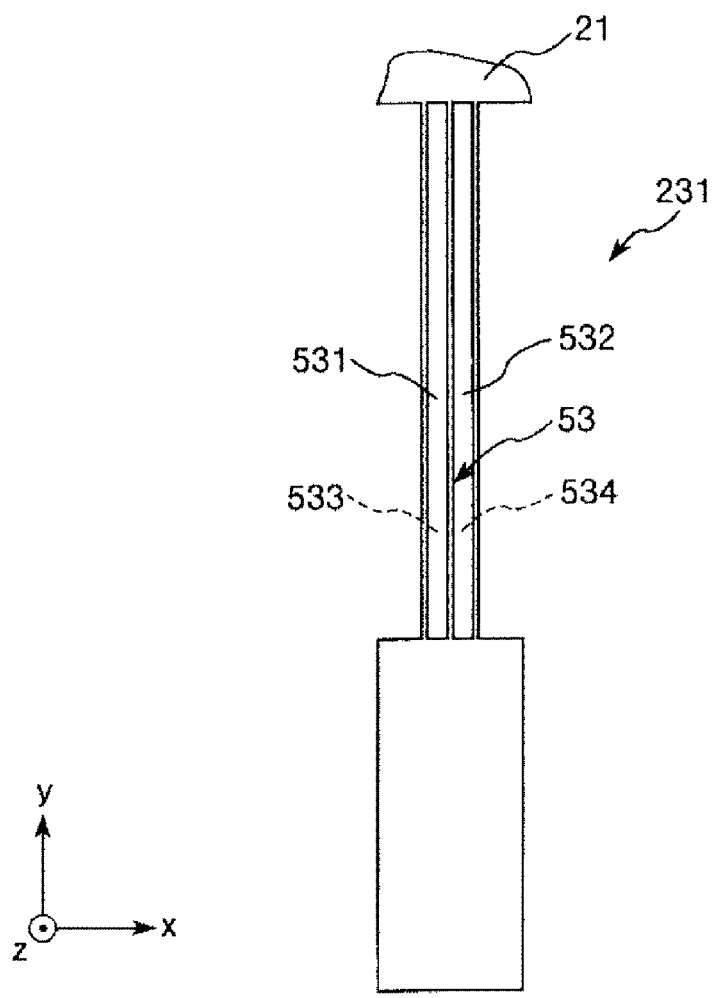
FIG. 5A is an enlarged plan view of a detection vibrating arm of the vibrating element shown in FIG. 3.
Figure 5B:
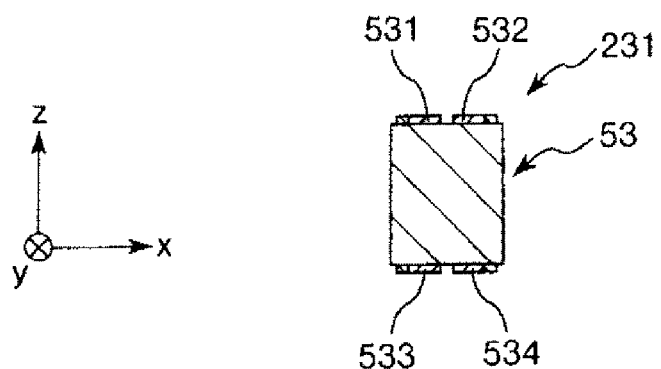
FIG. 5B is a cross-sectional view of the detection vibrating arm shown in FIG. 5A.
Figure 6A:
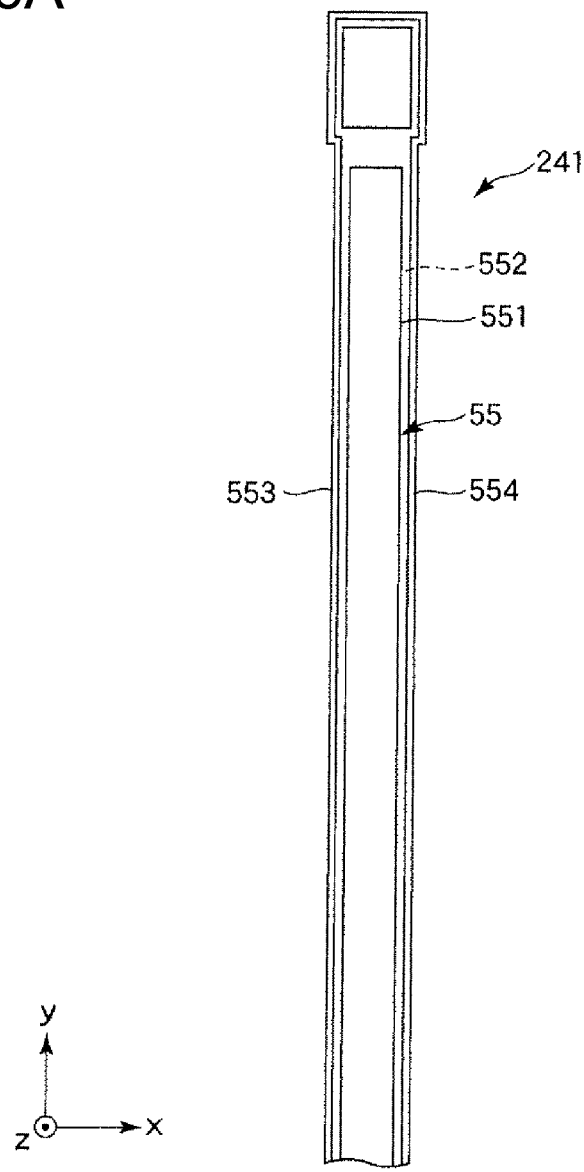
FIG. 6A is an enlarged plan view of an adjustment vibrating arm of the vibrating element shown in FIG. 3.
Figure 6B:
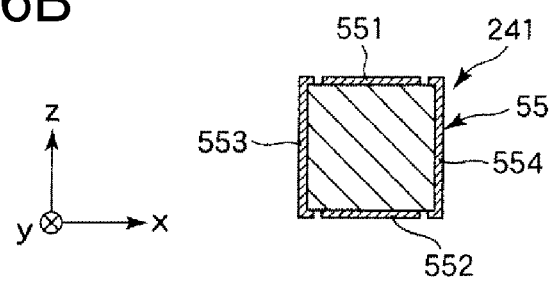
FIG. 6B is a cross-sectional view of the adjustment vibrating arm shown in FIG. 6A.
Figure 7:
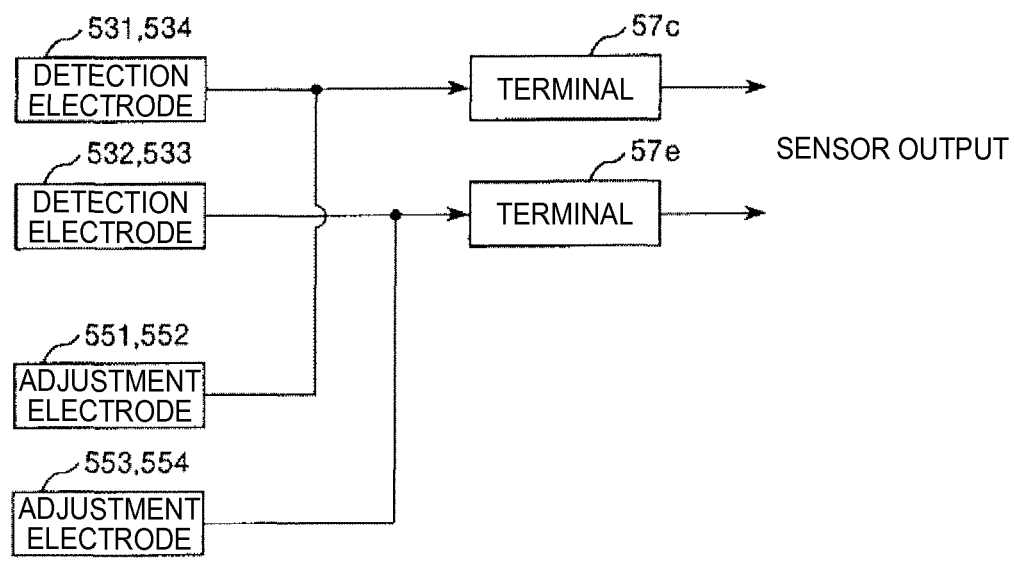
FIG. 7 is a diagram showing a connected state of detection electrodes and adjustment electrodes in the vibrating element shown in FIG. 3.
Figure 8:
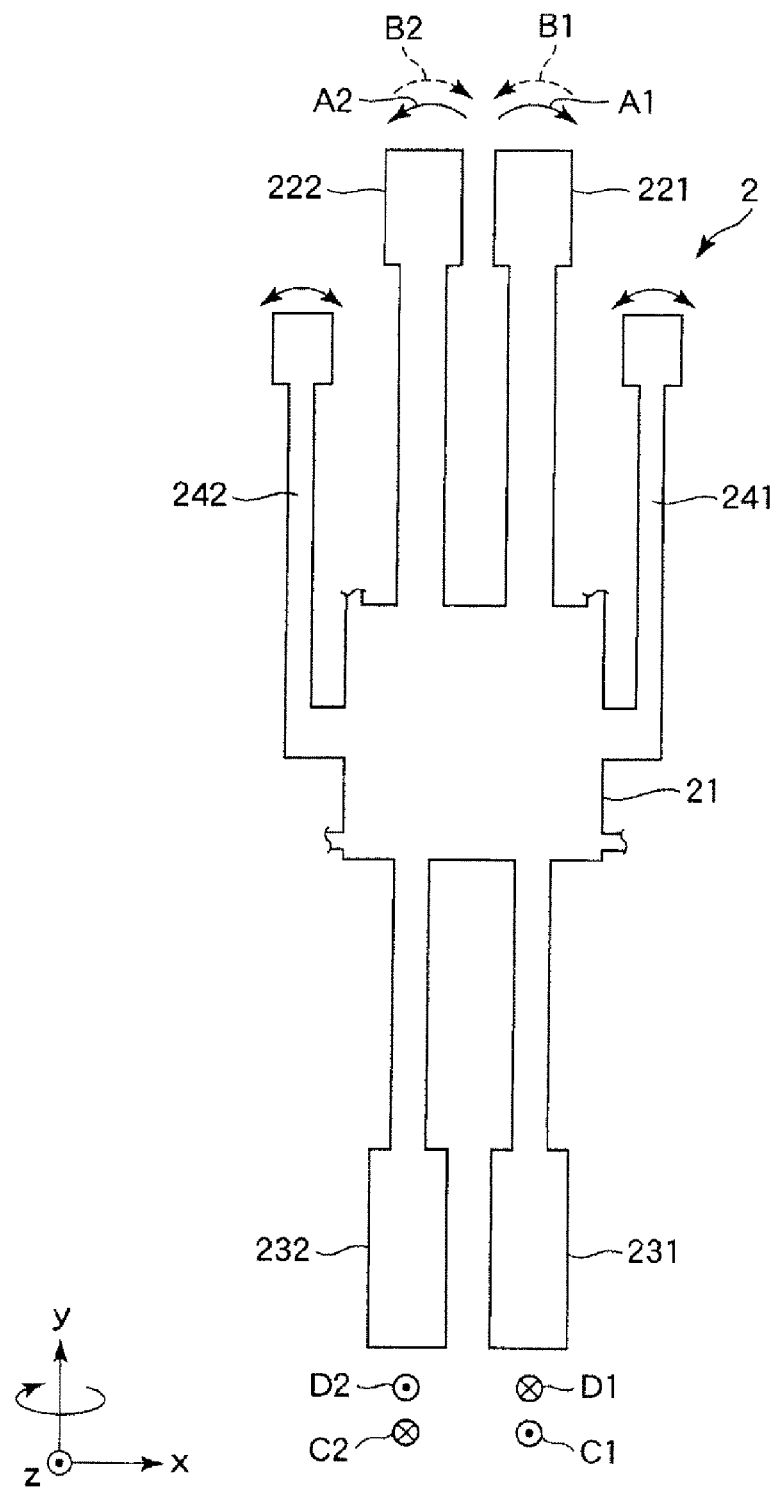
FIG. 8 is a diagram for explaining operation of a vibrator element shown in FIG. 3.
Figure 10A:
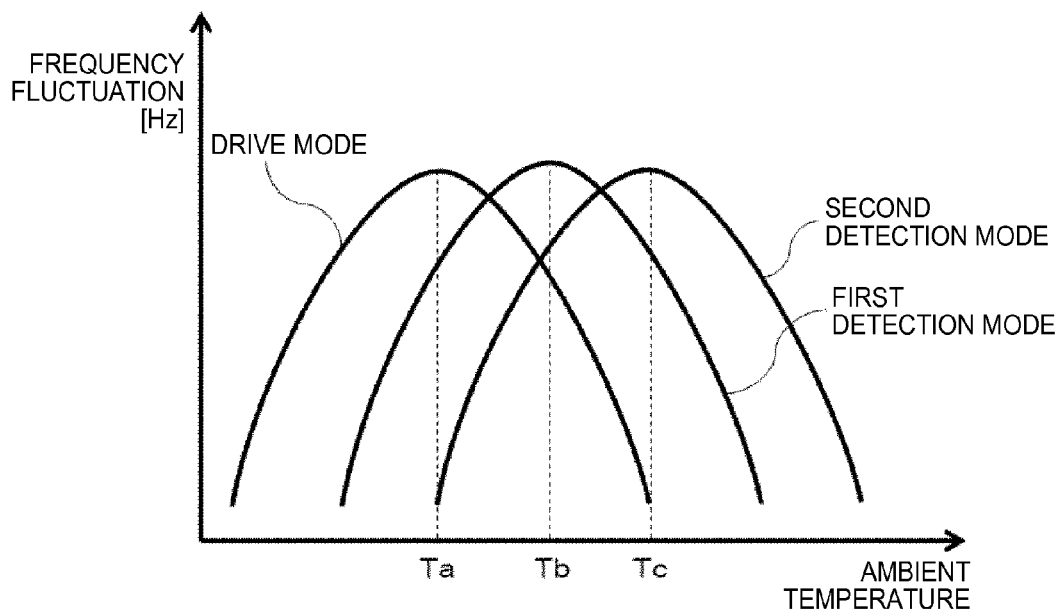
FIGS. 10A and 10B are graphs showing frequency-temperature characteristic curves in respective modes.
Figure 10B:
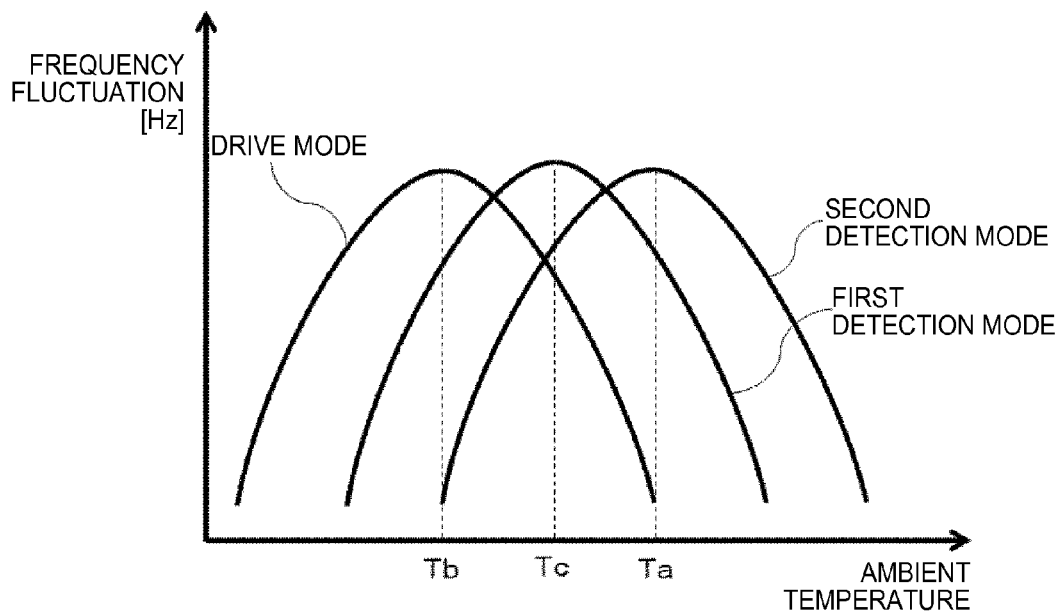
Figure 11A:
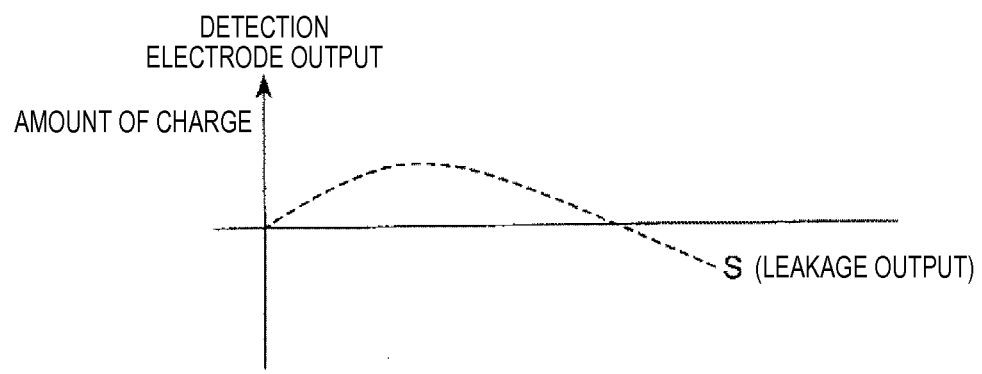
FIG. 11A is a diagram showing a leakage output of the detection electrode shown in FIGS. 5A and 5B.
Figure 11B:
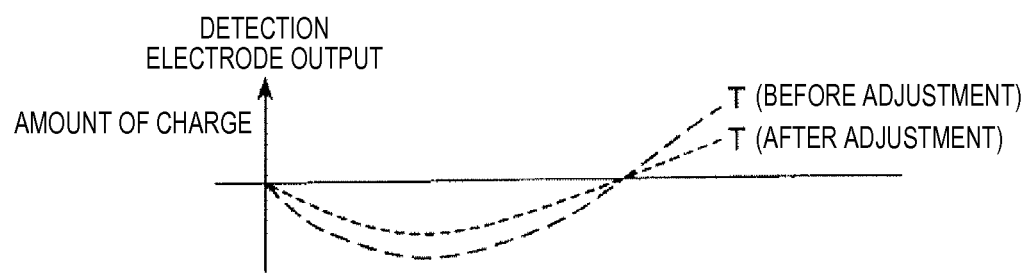
FIG. 11B is a diagram showing an output of the adjustment electrode shown in FIGS. 6A to 7.

FIG. 1 is a schematic cross-sectional view showing a schematic configuration of the oscillator including an embodiment of a vibrating element according to the invention. FIG. 2 is a plan view of the oscillator shown in FIG. 1. FIG. 3 is a plan view showing the vibrating element included in the oscillator shown in FIG. 1. FIG. 4A is an enlarged plan view of a drive vibrating arm of a vibrator element shown in FIG. 3. FIG. 4B is a cross-sectional view of the drive vibrating arm shown in FIG. 4A. FIG. 5A is an enlarged plan view of a detection vibrating arm of the vibrating element shown in FIG. 3. FIG. 5B is a cross-sectional view of the detection vibrating arm shown in FIG. 5A. FIG. 6A is an enlarged plan view of an adjustment vibrating arm of the vibrator element shown in FIG. 3. FIG. 6B is a cross-sectional view of the adjustment vibrating arm shown in FIG. 6A. FIG. 7 is a diagram showing a connected state of detection electrodes and adjustment electrodes in the vibrating element shown in FIG. 3. FIGS. 8 to 9B are diagrams explaining operation of the vibrating element shown in FIG. 3. FIGS. 10A and 10B are graphs showing frequency-temperature characteristic curves in respective modes. FIG. 11A is a diagram showing a leakage output of the detection electrode shown in FIGS. 5A and 5B. FIG. 11B is a diagram showing an output of the adjustment electrode shown in FIGS. 6A to 7.

For convenience of description, an x-axis, a y-axis, and a z-axis are illustrated as three axes orthogonal to each other in FIGS. 1 to 6B and 8A and 8B. In the following, a direction parallel to the x-axis is referred to as "x-axis direction", a direction parallel to the y-axis is referred to as "y-axis direction", and a direction parallel to the z-axis is referred to as "z-axis direction". Moreover, the positive z-axis side is referred to as "top", while the negative z-axis side is referred to as "down".

The oscillator 1 shown in FIGS. 1 and 2 is a gyro sensor that detects an angular velocity as a physical quantity.

The oscillator 1 can be used for, for example, camera-shake correction of imaging apparatuses, and attitude detection, attitude control, or the like for vehicles in mobile navigation systems using GPS (Global Positioning System) satellite signals.

The oscillator 1 includes a vibrating element 2, an IC chip 3, and a package 4 that accommodates the vibrating element 2 and the IC chip 3 as shown in FIGS. 1 and 2.

The parts constituting the oscillator 1 will be sequentially described below.

Vibrating Element

The vibrating element 2 is a gyro sensor element that detects an angular velocity about one axis.

As shown in FIG. 3, the vibrating element 2 includes a vibrator element 58 including a base portion 21, a pair of drive vibrating arms 221 and 222, a pair of detection vibrating arms 231 and 232, a pair of adjustment vibrating arms (vibrating arms) 241 and 242, a support portion (frame body) 25, four coupling portions 261, 262, 263, and 264, drive electrode groups 51 and 52, detection electrode groups 53 and 54, and adjustment electrode groups 55 and 56.

In the embodiment, the vibrator element 58 is integrally formed of a piezoelectric material. Although not particularly limited, quartz crystal is preferably used as the piezoelectric material. Due to this, characteristics of the vibrating element 2 can be made excellent.

Quartz crystal has an X-axis (electrical axis), a Y-axis (mechanical axis), and a Z-axis (optic axis) orthogonal to each other. The base portion 21, the pair of drive vibrating arms 221 and 222, the pair of detection vibrating arms 231 and 232, the pair of adjustment vibrating arms 241 and 242, the support portion 25, and the four coupling portions 261, 262, 263, and 264 can be formed by, for example, performing an etching process on a substrate made of quartz crystal with the Z-axis along the thickness direction and a plate surface parallel to the X-axis and the Y-axis. The thickness of the substrate is appropriately set according to the oscillation frequency (resonance frequency), external size, workability, and the like of the vibrating element 2. In the following, the case where the base portion 21, the pair of drive vibrating arms 221 and 222, the pair of detection vibrating arms 231 and 232, the pair of adjustment vibrating arms 241 and 242, the support portion 25, and the four coupling portions 261, 262, 263, and 264 are integrally made of quartz crystal will be described by way of example.

Vibrator Element

As described above, the vibrator element 58 includes the base portion 21, the pair of drive vibrating arms 221 and 222, the pair of detection vibrating arms 231 and 232, the pair of adjustment vibrating arms (vibrating arms) 241 and 242, the support portion (frame body) 25, the four coupling portions 261, 262, 263, and 264, the drive electrode groups 51 and 52, the detection electrode groups 53 and 54, and the adjustment electrode groups 55 and 56.

The base portion 21 is supported to the support portion 25 via the four coupling portions 261, 262, 263, and 264. Each of the four coupling portions 261, 262, 263, and 264 has a longitudinal shape with one end coupled to the base portion 21 and the other end coupled to the support portion 25.

Each of the drive vibrating arms 221 and 222 extends from the base portion 21 in the y-axis direction (positive y direction). Each of the drive vibrating arms 221 and 222 extends along the Y-axis of the quartz crystal. Further, a cross-section of each of the drive vibrating arms 221 and 222 has a rectangular shape composed of a pair of sides parallel to the x-axis and a pair of sides parallel to the z-axis.

The drive vibrating arm 221 is provided with the drive electrode group 51. Similarly, the drive vibrating arm 222 is provided with the drive electrode group 52.

The drive electrode group 51 will be representatively described below. The drive electrode group 52 is similar to the drive electrode group 51, and therefore, the description of the drive electrode group 52 is omitted.

As shown in FIGS. 4A and 4B, the drive electrode group 51 is composed of a drive electrode 511 provided on an upper surface of the drive vibrating arm 221, a drive electrode 512 provided on a lower surface of the drive vibrating arm 221, a drive electrode 513 provided on one side surface (on the left side in FIGS. 4A and 4B) of the drive vibrating arm 221, and a drive electrode 514 provided on the other side surface (on the right side in FIGS. 4A and 4B) of the drive vibrating arm 221.

The drive electrode 511 and the drive electrode 512 are electrically connected to each other via a wire (not shown) so as to be at the same potential. The drive electrode 513 and the drive electrode 514 are electrically connected to each other via a wire (not shown) so as to be at the same potential. The drive electrodes 511 and 512 are electrically connected via wires (not shown) to a terminal 57a provided in the support portion 25 shown in FIG. 3. The drive electrodes 513 and 514 are electrically connected via wires (not shown) to a terminal 57b provided in the support portion 25 shown in FIG. 3.

Each of the detection vibrating arms 231 and 232 extends from the base portion 21 in the y-axis direction (negative y direction). Each of the detection vibrating arms 231 and 232 extends along the Y-axis of the quartz crystal. Further, a cross-section of each of the detection vibrating arms 231 and 232 has a rectangular shape composed of a pair of sides parallel to the x-axis and a pair of sides parallel to the z-axis.

The detection vibrating arms 231 and 232 vibrate in response to physical quantities applied to the drive vibrating arms 221 and 222, respectively.

The detection vibrating arm 231 is provided with the detection electrode group 53. Similarly, the detection vibrating arm 232 is provided with the detection electrode group 54. By providing the detection electrode groups 53 and 54 on the detection vibrating arms 231 and 232 that are provided separately from the drive vibrating arms 221 and 222 as described above, the electrode areas (areas of portions that function as electrodes) of the detection electrodes of the detection electrode groups 53 and 54 can be increased. Therefore, the detection sensitivity of the vibrating element 2 can be improved. The detection vibrating arm 231 and the detection electrode group 53 constitute a detection portion. Similarly, the detection vibrating arm 232 and the detection electrode group 54 constitute a detection portion.

The detection electrode group 53 will be representatively described below. The detection electrode group 54 is similar to the detection electrode group 53, and therefore, the description of the detection electrode group 54 is omitted.

As shown in FIGS. 5A and 5B, the detection electrode group 53 is composed of detection electrodes 531 and 532 provided on an upper surface of the detection vibrating arm 231, and detection electrodes 533 and 534 provided on a lower surface of the detection vibrating arm 231. The detection electrodes 531 and 533 are provided on one side (on the left side in FIGS. 5A and 5B) of the detection vibrating arm 231 in the width direction thereof. The detection electrodes 532 and 534 are provided on the other side (on the right side in FIGS. 5A and 5B) of the detection vibrating arm 231 in the width direction thereof.

The detection electrode 531 and the detection electrode 534 are electrically connected to each other via a wire (not shown) so as to be at the same potential. The detection electrode 532 and the detection electrode 533 are electrically connected to each other via a wire (not shown) so as to be at the same potential. The detection electrodes 531 and 534 are paired, and the detection electrodes 532 and 533 are paired.

The detection electrodes 531 and 534 are electrically connected via wires (not shown) to a terminal 57c provided in the support portion 25 shown in FIG. 3. The detection electrodes 532 and 533 are electrically connected via wires (not shown) to a terminal 57e provided in the support portion 25 shown in FIG. 3. The detection electrode group 54 is electrically connected via wires (not shown) to terminals 57d and 57f provided in the support portion 25 shown in FIG. 3.

Each of the adjustment vibrating arms 241 and 242 extends from the base portion 21 in the y-axis direction. Each of the adjustment vibrating arms 241 and 242 extends along the Y-axis of the quartz crystal. Further, a cross-section of each of the adjustment vibrating arms 241 and 242 has a rectangular shape composed of a pair of sides parallel to the x-axis and a pair of sides parallel to the z-axis. Each of the adjustment vibrating arms 241 and 242 has a rectangular shape, and includes a top surface (first surface), a rear surface (second surface), and side surfaces coupling the top surface with the rear surface.

The adjustment vibrating arms 241 and 242 are provided so as to be parallel to the drive vibrating arms 221 and 222. That is, the drive vibrating arms 221 and 222 and the adjustment vibrating arms 241 and 242 extend in directions parallel to each other. Due to this, when the drive vibrating arms 221 and 222, the adjustment vibrating arms 241 and 242, and the like are made of quartz crystal, the drive vibrating arms 221 and 222 and the adjustment vibrating arms 241 and 242 can be configured so as to extend along the Y-axis of the quartz crystal, so that the drive vibrating arms 221 and 222 can be efficiently vibrated and charges can be generated at adjustment electrodes 551 to 554 described later with a simple configuration.

The adjustment vibrating arm 241 is provided with the adjustment electrode group 55. Similarly, the adjustment vibrating arm 242 is provided with the adjustment electrode group 56.

The adjustment electrode group 55 will be representatively described below. The adjustment electrode group 56 is similar to the adjustment electrode group 55, and therefore, the description of the adjustment electrode group 56 is omitted.

As shown in FIGS. 6A and 6B, the adjustment electrode group 55 is composed of the adjustment electrode 551 provided on an upper surface of the adjustment vibrating arm 241, the adjustment electrode 552 provided on a lower surface of the adjustment vibrating arm 241, the adjustment electrode (side surface electrode) 553 provided on one side surface (on the left side in FIGS. 6A and 6B) of the adjustment vibrating arm 241, and the adjustment electrode (side surface electrode) 554 provided on the other side surface (on the right side in FIGS. 6A and 6B) of the adjustment vibrating arm 241.

The adjustment electrode 551 and the adjustment electrode 552 are formed so as to overlap each other as viewed in a plan view. That is, the adjustment electrode 551 and the adjustment electrode 552 are formed such that the outer shapes thereof coincide with each other as viewed in the plan view.

The adjustment electrode 551 and the adjustment electrode 552 are electrically connected to each other via a wire (not shown) so as to be at the same potential. The adjustment electrode 553 and the adjustment electrode 554 are electrically connected to each other so as to be at the same potential. The adjustment electrodes 551 and 552 are paired, and the adjustment electrodes 553 and 554 are paired.

The adjustment electrodes 551 and 552 are electrically connected via wires (not shown) to the terminal 57e provided in the support portion 25 shown in FIG. 3 together with the detection electrodes 532 and 533. The adjustment electrodes 553 and 554 are electrically connected via wires (not shown) to the terminal 57c provided in the support portion 25 shown in FIG. 3 together with the detection electrodes 531 and 534. The adjustment electrode group 56 is electrically connected via wires (not shown) to the terminals 57d and 57f provided in the support portion 25 shown in FIG. 3 together with the detection electrode group 54.

In the vibrating element 2 including the adjustment electrodes 551 to 554, as shown in FIG. 7, the amount of charge obtained by adding the amount of charge generated at the adjustment electrodes 551 and 552 to the amount of charge generated at the detection electrodes 531 and 534, and the amount of charge obtained by adding the amount of charge generated at the adjustment electrodes 553 and 554 to the amount of charge generated at the detection electrodes 532 and 533 can be output as sensor outputs (hereinafter simply referred to also as "sensor outputs") from the terminals 57c and 57e, respectively.

The polarity of the charge generated at the adjustment electrodes 551 and 552 and the adjustment electrodes 553 and 554 is opposite to that of the charge generated at the detection electrodes 531 and 534 and the detection electrodes 532 and 533. Therefore, at least a portion of the charge generated at the detection electrodes 531 and 534 and the detection electrodes 532 and 533 is canceled out.

In the adjustment electrodes 551 and 552, the sensor output can be adjusted by removing a portion of the adjustment electrodes 551 and 552. That is, by removing a portion of the adjustment electrodes 551 and 552, the amount of charge between the adjustment electrodes 551 and 552 and the adjustment electrodes 553 and 554 can be reduced to adjust the sensor output. For example, the sensor output can be adjusted (corrected) such that the sensor output in a state where no physical quantity is applied to the vibrating element 2 (hereinafter also referred to as "zero-point output") is zero. Due to this, the vibrating element 2 having high sensitivity is obtained.

The vibrating element 2 configured as described above has a drive mode, a first detection mode, and a second detection mode.

In the drive mode, a drive signal is applied between the terminal 57a and the terminal 57b, whereby the drive vibrating arm 221 and the drive vibrating arm 222 flexurally vibrate (drive-vibrate) close to or away from each other as shown in FIG. 8. That is, a state where the drive vibrating arm 221 is flexed in a direction of an arrow A1 shown in FIG. 8 and the drive vibrating arm 222 is flexed in a direction of an arrow A2 shown in FIG. 8, and a state where the drive vibrating arm 221 is flexed in a direction of an arrow B1 shown in FIG. 8 and the drive vibrating arm 222 is flexed in a direction of an arrow B2 shown in FIG. 8 are alternately repeated.

When an angular velocity ω about the y-axis is applied to the vibrating element 2 in the state where the drive vibrating arms 221 and 222 are drive-vibrated, the drive vibrating arms 221 and 222 flexurally vibrate in opposite directions along the z-axis direction with the Coriolis force. Consequently, the detection vibrating arms 231 and 232 flexurally vibrate (detection-vibrate) in opposite directions along the z-axis direction. That is, a state where the detection vibrating arm 231 is flexed in a direction of an arrow C1 shown in FIG. 8 and the detection vibrating arm 232 is flexed in a direction of an arrow C2 shown in FIG. 8, and a state where the detection vibrating arm 231 is flexed in a direction of an arrow D1 shown in FIG. 8 and the detection vibrating arm 232 is flexed in a direction of an arrow D2 shown in FIG. 8 are alternately repeated.

By detecting the charge generated at the detection electrode groups 53 and 54 due to the detection vibrations of the detection vibrating arms 231 and 232, the angular velocity ω applied to the vibrating element 2 can be obtained.

In this case, the adjustment vibrating arms 241 and 242 are also excited so as to flexurally vibrate in directions close to or away from each other with the drive vibrations of the drive vibrating arms 221 and 222. Due to this, charge is generated at the adjustment electrodes 551 and 552 and the adjustment electrodes 553 and 554. Therefore, by adjusting the amount of the charge, at least a portion of the charge generated at the detection electrodes 531 and 534 and the detection electrodes 532 and 533 can be canceled out.

Figure 9A:
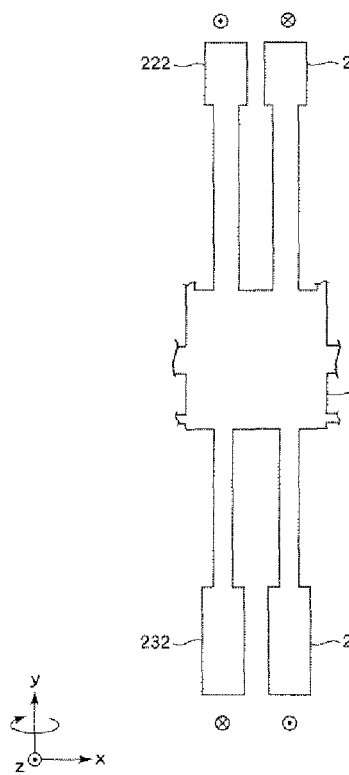
FIGS. 9A and 9B are diagrams showing operation of the vibrator element shown in FIG. 3.
Figure 9B:
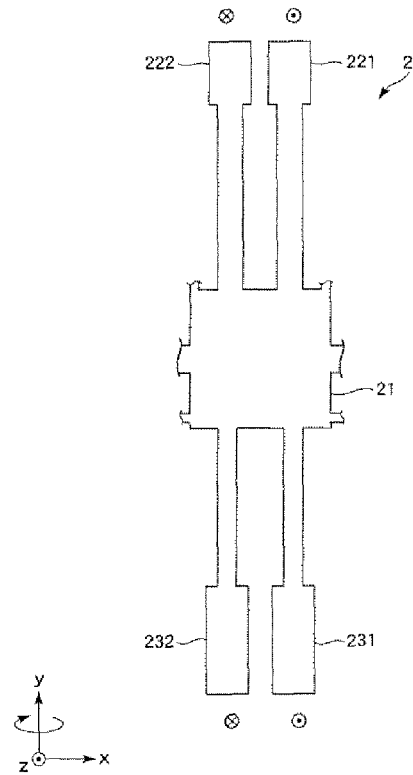

In the first detection mode, as shown in FIG. 9A, the drive vibrating arms 221 and 222 flexurally vibrate in phase opposition relative to the direction of action of the Coriolis force and in opposite directions along the Z-axis direction. Due to this, the detection vibrating arms 231 and 232 flexurally vibrate in opposite directions, as vibrating arms next to each other, along the Z-axis direction and in phase opposition to the drive vibrating arms 221 and 222.

In the second detection mode, as shown in FIG. 9B, the drive vibrating arms 221 and 222 flexurally vibrate in phase relative to the direction of action of the Coriolis force and in opposite directions along the Z-axis direction. Due to this, the detection vibrating arms 231 and 232 flexurally vibrate in opposite directions, as vibrating arms next to each other, along the Z-axis direction and in phase with the drive vibrating arms 221 and 222.

As described above, the vibrating element 2 has the drive mode, the first detection mode, and the second detection mode. As a result, the vibrating arms of the vibrating element 2 flexurally vibrate in a vibration mode in which the first and second detection modes are superimposed on each other. The flexural vibrations of the drive vibrating arms 221 and 222 in the first detection mode are opposite in phase to those in the second detection mode. In contrast, the flexural vibrations of the detection vibrating arms 231 and 232 in the first detection mode are the same in phase as those in the second detection mode. Therefore, an excitation force is increased to make the amplitude greater than in the case where the vibrating arms vibrate only in any one of the first and second detection modes. Hence, any of the detection vibrating arms 231 and 232 obtains an electric signal of higher voltage from the detection electrode groups 53 and 54, so that the rotation, angular velocity, or the like of the vibrating element 2 is obtained with higher detection sensitivity.

The vibrating element 2 is configured such that, in frequency-temperature characteristic curves representing a change in frequency due to a change in temperature in the respective modes with the horizontal axis representing the ambient temperature and the vertical axis representing the change in frequency, when the turnover temperature of the frequency-temperature characteristic curve in the drive mode is Ta [° C.], the turnover temperature of the frequency-temperature characteristic curve in the first detection mode is Tb [° C.], and the turnover temperature of the frequency-temperature characteristic curve in the second detection mode is Tc [° C.], Ta is lower than Tb and Tc (for example, FIG. 10A), or Ta is higher than Tb and Tc (for example, FIG. 10B).

With the configuration described above, it is possible to suppress degradation in characteristics associated with a change in frequency due to a change in temperature. That is, with the configuration described above, when the resonance frequency in the drive mode and the resonance frequency in the first detection mode are close to each other due to a change in temperature, the sensitivity is increased and the vibration leakage is also increased, and, at the same time, the resonance frequency in the drive mode and the resonance frequency in the second detection mode are away from each other, so that the sensitivity is reduced and the vibration leakage is also reduced. As a result, the increases and reductions in sensitivity and vibration leakage due to a change in temperature are suppressed, so that the degradation in characteristics is suppressed.

Moreover, when the resonance frequency in the drive mode is fa, the resonance frequency in the first detection mode is fb, and the resonance frequency in the second detection mode is fc, it is preferable that fa falls between fb and fc. Due to this, the sensitivity can be further improved while suppressing the degradation in characteristics such as sensitivity associated with a change in frequency due to a change in temperature.

In the vibrating element 2, if the cross-sectional shape of the drive vibrating arms 221 and 222 is not formed as designed because of variations in manufacture, when the drive vibrating arms 221 and 222 are vibrated by energization without applying a physical quantity to the vibrating element 2, charge serving as a leakage output S is generated between the detection electrodes 531 and 534 and the detection electrodes 532 and 533 as shown in FIG. 11A.

Moreover, in the vibrating element 2, in the state where the drive vibrating arms 221 and 222 are vibrated by energization regardless of whether or not a physical quantity is applied to the vibrating element 2, charge serving as an adjusting output T is generated between the adjustment electrodes 551 and 552 and the adjustment electrodes 553 and 554 as shown in FIG. 11B.

Since the polarity of the leakage output S is opposite to that of the adjusting output T, the zero-point output of the vibrating element 2 can be made zero by setting the absolute value of the adjusting output T equal to the absolute value of the leakage output S.

In contrast, the sensor output can be adjusted by removing a portion of the adjustment electrodes 551 and 552 as described above. However, if it is impossible in this case to correctly estimate the absolute value of the leakage output S, it is of course impossible to make the zero-point output of the vibrating element 2 zero. In the invention, therefore, an additional vibrator element 59 described later is included to thereby make it possible to correctly estimate the leakage output S.

Although the oscillator 1 and the vibrating element 2 have been described above, the form of the vibrator element 58 of the vibrating element 2 is not limited to the form of a so-called H-shaped tuning fork. For example, various forms such as a double-T type, a double-ended tuning fork, a trident tuning fork, a comb-tooth type, an orthogonal type, and a square beam type may be adopted.

The number of the drive vibrating arms, the detection vibrating arms, and the adjustment vibrating arms may be one or three or more. Moreover, the drive vibrating arms may also function as the detection vibrating arms.

The adjustment vibrating arms may not be provided.

The number, position, shape, size, and the like of the drive electrodes are not limited to the embodiment described above as long as the drive vibrating arms can be vibrated by energization.

The number, position, shape, size, and the like of the detection electrodes are not limited to the embodiment described above as long as vibrations of the drive vibrating arms caused by application of a physical quantity can be electrically detected.

The number, position, shape, size, and the like of the adjustment electrodes are not limited to the embodiment described above as long as charge generated associated with drive vibrations of the adjustment vibrating arms can be output.

IC Chip

The IC chip 3 shown in FIGS. 1 and 2 is an electronic component having a function to drive the vibrating element 2 and a function to detect an output (sensor output) from the vibrating element 2.

Although not shown in the drawing, the IC chip 3 includes a driver circuit that drives the vibrating element 2 and a detection circuit that detects an output from the vibrating element 2.

Moreover, the IC chip 3 is provided with a plurality of connection terminals 31.

Package

As shown in FIGS. 1 and 2, the package 4 includes a base member 41 (base) having a recess that opens upward, and a lid member 42 (lid) provided so as to cover the recess of the base member 41. Due to this, an interior space for accommodating the vibrating element 2 and the IC chip 3 is formed between the base member 41 and the lid member 42.

The base member 41 is composed of a flat plate body 411 (plate portion) and a frame body 412 (frame portion) bonded to an outer peripheral portion of an upper surface of the plate body 411.

The base member 41 is made of, for example, aluminum oxide sintered body, quartz crystal, glass, or the like.

As shown in FIG. 1, the support portion 25 of the vibrating element 2 is bonded to an upper surface (surface on the side covered with the lid member 42) of the base member 41 with bonding members 81 such as an adhesive made by including, for example, epoxy resin, acrylic resin, or the like. Due to this, the vibrating element 2 is supported and fixed to the base member 41.

The IC chip 3 is bonded to the upper surface of the base member 41 with a bonding member 82 such as an adhesive made by including, for example, epoxy resin, acrylic resin, or the like. Due to this, the IC chip 3 is supported and fixed to the base member 41.

Further, as shown in FIGS. 1 and 2, a plurality of internal terminals 71 and a plurality of internal terminals 72 are provided on the upper surface of the base member 41.

The terminals 57a to 57f of the vibrating element 2 are electrically connected to the plurality of internal terminals 71 via, for example, wires composed of bonding wires.

The plurality of internal terminals 71 are electrically connected to the plurality of internal terminals 72 via wires (not shown).

The plurality of connection terminals 31 of the IC chip 3 are electrically connected to the plurality of internal terminals 72 via, for example, wires composed of bonding wires.

On the other hand, as shown in FIG. 1, a plurality of external terminals 73 used when mounting the oscillator 1 to an apparatus (external apparatus) into which the oscillator 1 is incorporated are provided on a lower surface (bottom surface of the package 4) of the base member 41.

The plurality of external terminals 73 are electrically connected to the internal terminals 72 via internal wires (not shown). Due to this, the IC chip 3 and the plurality of external terminals 73 are electrically connected.

Each of the internal terminals 71 and 72 and the external terminals 73 is made of, for example, a metal coating formed by stacking a coating of nickel (Ni), gold (Au), or the like on a metallization layer of tungsten (W) or the like by plating or the like.

The lid member 42 is hermetically bonded to the base member 41. Due to this, the package 4 is hermetically sealed.

The lid member 42 is made of, for example, the same material as that of the base member 41, or metal such as Kovar, 42 Alloy, or stainless steel.

A bonding method of the base member 41 and the lid member 42 is not particularly limited, and, for example, a bonding method using a brazing material, an adhesive made of curable resin or the like, or a welding method such as seam welding, laser welding or the like can be used.

Such bonding is conducted under a reduced pressure or an inert gas atmosphere, so that the interior of the package 4 can be maintained in the reduced-pressure state or the inert gas sealed state.

According to the vibrating element 2 included in the oscillator 1 according to the embodiment described above, excellent detection sensitivity can be exhibited simply and reliably.

Moreover, according to the oscillator 1 including the vibrating element 2, excellent detection sensitivity is provided.

The oscillator 1 (the vibrating element 2) described above can be incorporated into various kinds of electronic apparatuses for use.

According to the electronic apparatuses, reliability can be made excellent.

Vibrator

Next, a vibrator including the vibrating element according to the invention will be described.

Figure 12:
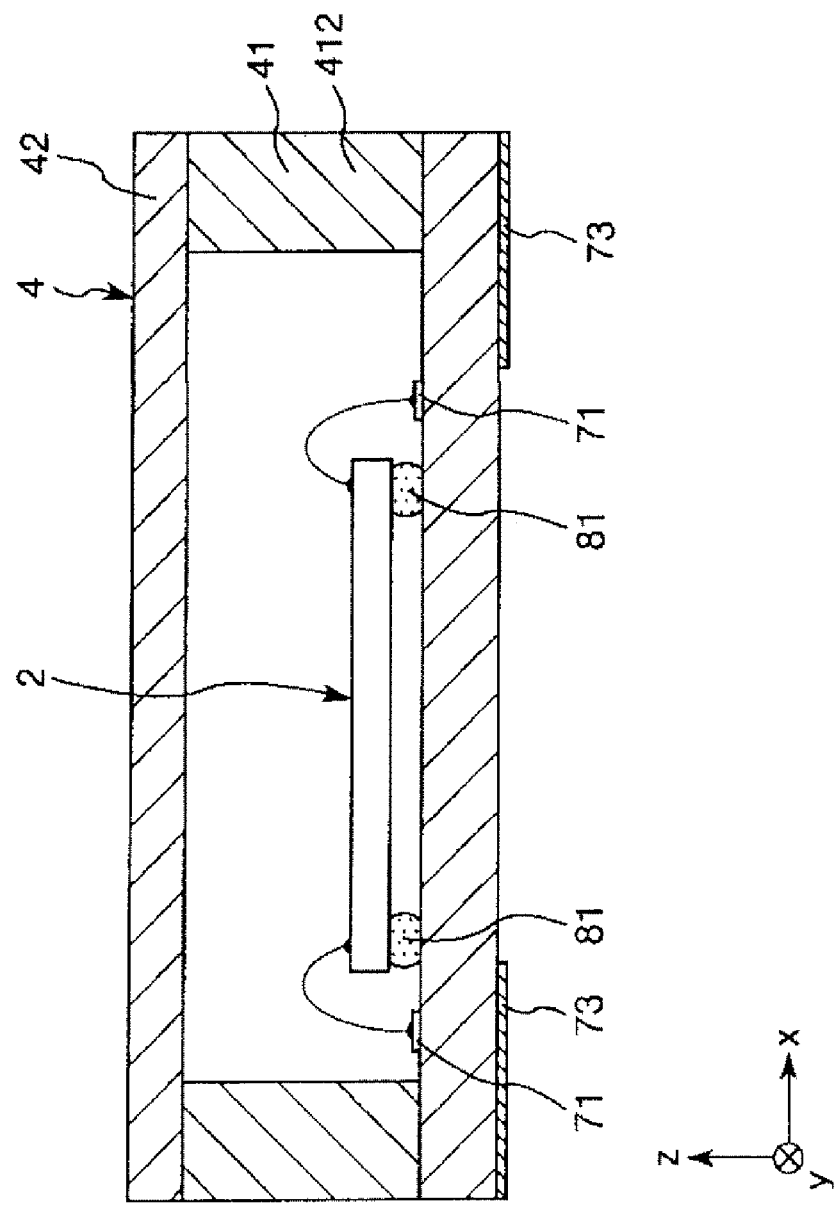
FIG. 12 is a schematic cross-sectional view showing a schematic configuration of a vibrator including the embodiment of the vibrating element according to the invention.

FIG. 12 is a schematic cross-sectional view showing a schematic configuration of the vibrator including the embodiment of the vibrating element according to the invention.

The vibrator 1A includes the vibrating element 2 shown in FIG. 3 and the package 4 that accommodates the vibrating element 2.

The package 4 includes the base member 41 (base) having the recess that opens upward, and the lid member 42 (lid) provided so as to cover the recess of the base member 41. Due to this, an interior space for accommodating the vibrating element 2 is formed between the base member 41 and the lid member 42.

The base member 41 is composed of the flat plate body 411 (plate portion) and the frame body 412 (frame portion) bonded to the outer peripheral portion of the upper surface of the plate body 411.

As shown in FIG. 12, the support portion 25 of the vibrating element 2 is bonded to the upper surface (surface on the side covered with the lid member 42) of the base member 41 with the bonding members 81 such as an adhesive made by including, for example, epoxy resin, acrylic resin, or the like. Due to this, the vibrating element 2 is supported and fixed to the base member 41.

Further, the plurality of internal terminals 71 and the plurality of internal terminals 72 are provided on the upper surface of the base member 41.

The terminals 57a to 57f of the vibrating element 2 are electrically connected to the plurality of internal terminals 71 via, for example, wires composed of bonding wires.

The plurality of internal terminals 71 are electrically connected to the plurality of internal terminals 72 via wires (not shown).

According to the vibrator 1A including the vibrating element 2 described above, the sensitivity can be further improved while suppressing degradation in characteristics such as sensitivity associated with a change in frequency due to a change in temperature.

Electronic Apparatus

Examples of an electronic apparatus including the vibrating element according to the invention will be described in detail based on FIGS. 13 to 15.

Figure 13:
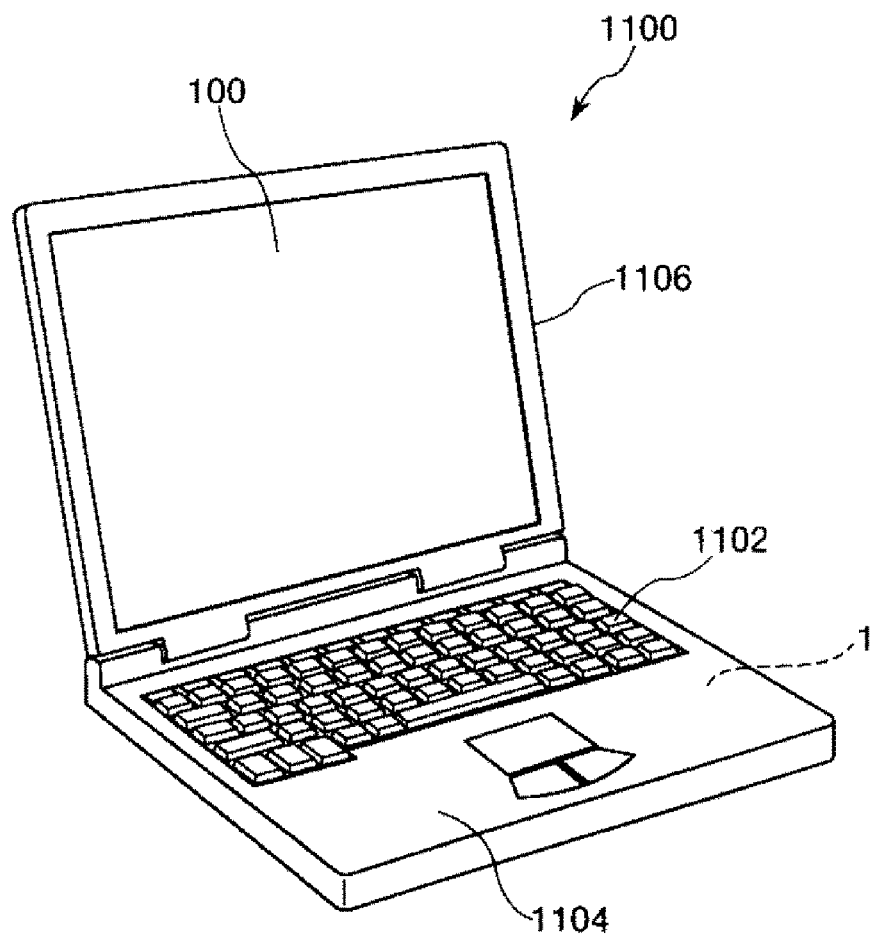
FIG. 13 is a perspective view showing a configuration of a mobile (or notebook) personal computer including the vibrating element according to the invention.

FIG. 13 is a perspective view showing a configuration of a mobile (or notebook) personal computer including the vibrating element according to the invention.

In the drawing, the personal computer 1100 is composed of a main body portion 1104 including a keyboard 1102 and a display unit 1106 including a display portion 100. The display unit 1106 is rotatably supported relative to the main body portion 1104 via a hinge structure portion.

In the personal computer 1100, the oscillator 1 that functions as a gyro sensor is built.

Figure 14:
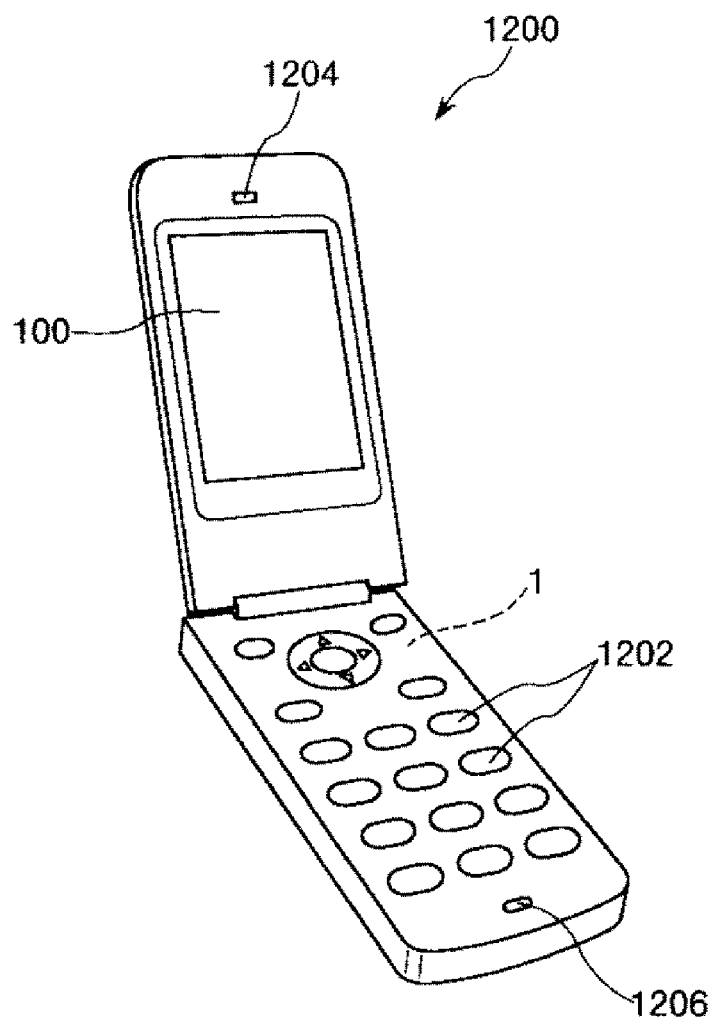
FIG. 14 is a perspective view showing a configuration of a mobile phone (including a PHS) including the vibrating element according to the invention.

FIG. 14 is a perspective view showing a configuration of a mobile phone (including a PHS) including the vibrating element according to the invention.

In the drawing, the mobile phone 1200 includes a plurality of operation buttons 1202, an earpiece 1204, and a mouthpiece 1206. The display portion 100 is provided between the operation buttons 1202 and the earpiece 1204.

In the mobile phone 1200, the oscillator 1 that functions as a gyro sensor is built.

Figure 15:
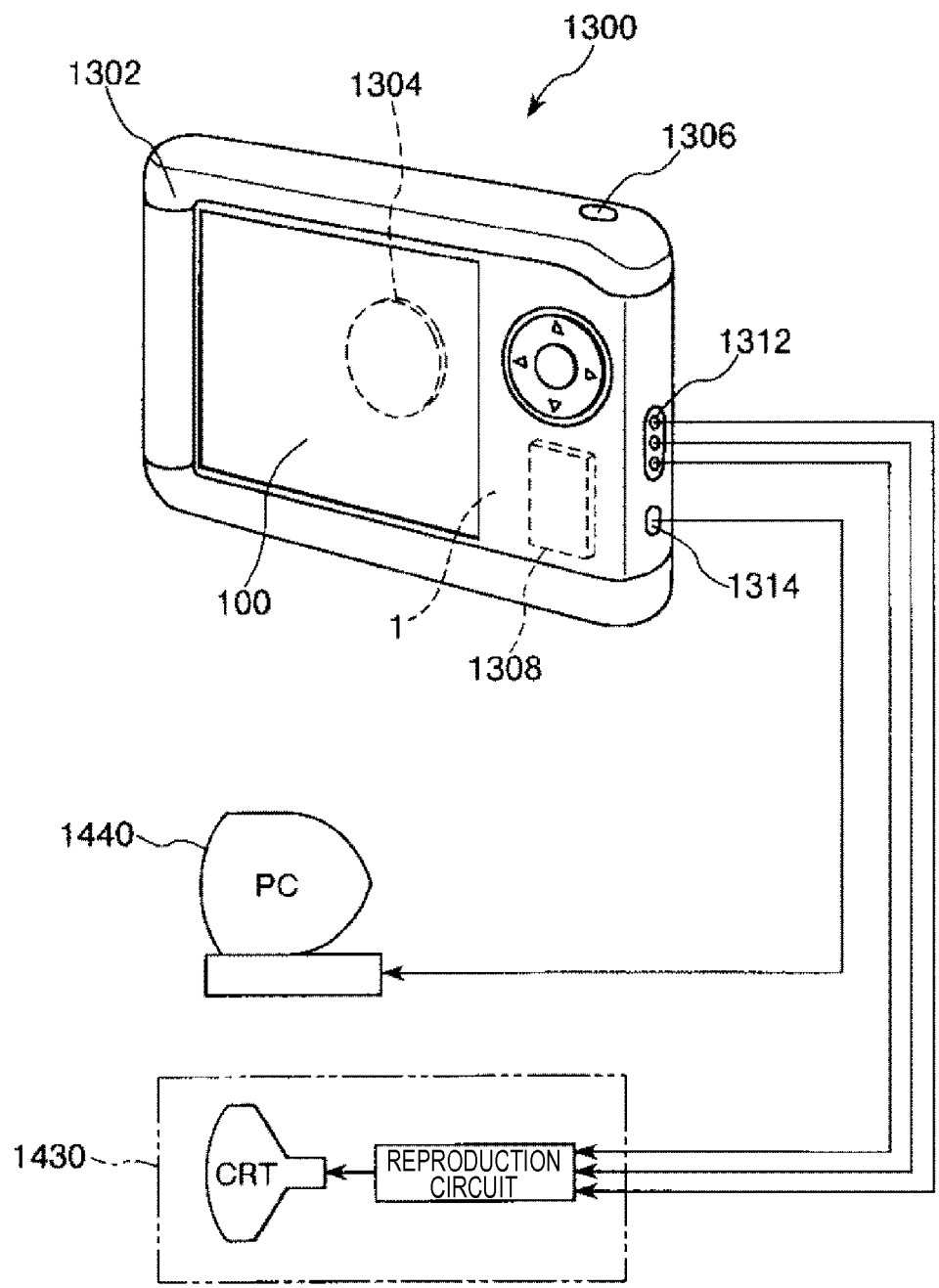
FIG. 15 is a perspective view showing a configuration of a digital still camera including the vibrating element according to the invention.

FIG. 15 is a perspective view showing a configuration of a digital still camera including the vibrating element according to the invention. In the drawing, connections with external apparatuses are also shown in a simplified manner.

Here, usual cameras expose a silver halide photographic film with an optical image of a subject, whereas the digital still camera 1300 photoelectrically converts the optical image of the subject with an imaging element such as a CCD (Charge Coupled Device) to generate imaging signals (image signals).

A display portion is provided on a back surface of a case (body) 1302 in the digital still camera 1300 and configured to perform display based on imaging signals generated by the CCD. The display portion functions as a finder that displays the subject as an electronic image.

Moreover, on the front side (the rear side in the drawing) of the case 1302, a light receiving unit 1304 including an optical lens (imaging optical system) and the CCD is provided.

When a photographer confirms the subject image displayed on the display portion and presses down a shutter button 1306, imaging signals of the CCD at the time are transferred to and stored in a memory 1308.

In the digital still camera 1300, a video signal output terminal 1312 and a data communication input/output terminal 1314 are provided on a side surface of the case 1302. Then, as shown in the drawing, a television monitor 1430 and a personal computer 1440 are connected as necessary to the video signal output terminal 1312 and the data communication input/output terminal 1314, respectively. Further, the imaging signals stored in the memory 1308 are output to the television monitor 1430 or the personal computer 1440 by a predetermined operation.

In the digital still camera 1300, the oscillator 1 (the vibrating element 2) that functions as a gyro sensor is built.

In addition to the personal computer (mobile personal computer) in FIG. 13, the mobile phone in FIG. 14, and the digital still camera in FIG. 15, the electronic apparatus according to the invention can be applied to for example, according to the types of an electronic device, automobile body attitude detection devices, pointing devices, head-mounted displays, inkjet ejection devices (for example, inkjet printers), laptop personal computers, television sets, video camcorders, video tape recorders, car navigation systems, pagers, electronic notebooks (including those with communication function), electronic dictionaries, calculators, electronic gaming machines, game controllers, word processors, workstations, videophones, surveillance television monitors, electronic binoculars, POS terminals, medical apparatuses (for example, electronic thermometers, sphygmomanometers, blood glucose meters, electrocardiogram measuring systems, ultrasonic diagnosis apparatuses, and electronic endoscopes), fishfinders, various types of measuring instrument, indicators (for example, indicators used in vehicles, aircraft, and ships), and flight simulators.

Moving Object

Figure 16:
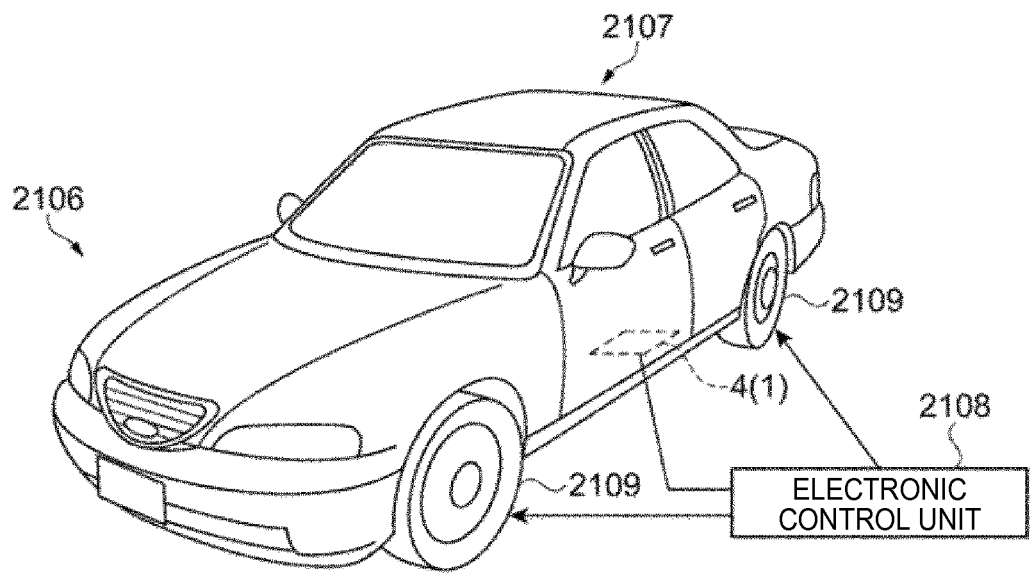
FIG. 16 is a perspective view showing a configuration of an automobile as an example of a moving object according to the invention.

FIG. 16 is a perspective view showing a configuration of an automobile as an example of a moving object according to the invention.

In the drawing, the oscillator 1 (the vibrating element 2) is built in an electronic control unit 2108 that controls tires 2109, and is mounted in an automobile body 2107.

A vibrator or oscillator including the vibrator element according to the invention is mounted in the automobile 2106, and can be widely applied to an electronic control unit (ECU) 2108 such as for, for example, keyless entry systems, immobilizers, car navigation systems, car air-conditioners, antilock brake systems (ABSs), air bags, tire pressure monitoring systems (TPMSs), engine control, battery monitors of hybrid and electric automobiles, and automobile body attitude control systems.

According to the moving object described above, excellent reliability is provided.

Although the vibrating element, the vibrator, the oscillator, the electronic apparatus, and the moving object according to the invention have been described above based on the embodiments shown in the drawings, the invention is not limited to the embodiments.

Moreover, in the vibrating element, the vibrator, the oscillator, the electronic apparatus, and the moving object according to the invention, the configuration of each part can be replaced with any configuration exhibiting a similar function, and also, any configuration can be added to the configuration of each part.

Moreover, in the vibrating element, the vibrator, the oscillator, the electronic apparatus, and the moving object according to the invention, any configurations of the embodiments may be combined with each other.

The entire disclosure of Japanese Patent Application No. 2013-224053, filed Oct. 29, 2013 is expressly incorporated by reference herein.

What is claimed is:

1. A vibrating element comprising:
   a drive vibrating portion configured to perform a drive mode; and
   a detection vibrating portion configured to perform first and second detection modes in which the detection vibrating portion vibrates in a direction orthogonal to a vibration direction of the drive vibrating portion in the drive mode, wherein
   when a resonance frequency in the drive mode is fa, a resonance frequency in the first detection mode is fb, and a resonance frequency in the second detection mode is fc, the fa falls between the fb and the fc, and
   in first through third frequency-temperature characteristic curves representing the drive, first detection and second detection modes, respectively, when a turnover temperature of the first frequency-temperature characteristic curve of the fa is Ta [° C.], a turnover temperature of the second frequency-temperature characteristic curve of the fb is Tb [° C.], and a turnover temperature of the third frequency-temperature characteristic curve of the fc is Tc [° C.], the Ta is lower than the Tb and the Tc, or the Ta is higher than the Tb and the Tc.

2. The vibrating element according to claim 1, comprising:
   a base portion;
   a pair of drive vibrating arms, which configure the drive vibrating portion, extended from the base portion; and
   a pair of detection vibrating arms, which configure the detection vibrating portion, extended from the base portion in a direction opposite to the pair of drive vibrating arms.

3. A vibrator comprising:
   the vibrating element according to claim 1; and
   a package in which the vibrating element is accommodated.

4. A vibrator comprising:
   the vibrating element according to claim 2; and
   a package in which the vibrating element is accommodated.

5. An oscillator comprising:
   the vibrating element according to claim 1; and
   an oscillation circuit electrically connected to the vibrating element.

6. An oscillator comprising:
   the vibrating element according to claim 2; and
   an oscillation circuit electrically connected to the vibrating element.

7. An electronic apparatus comprising the vibrating element according to claim 1.

8. An electronic apparatus comprising the vibrating element according to claim 2.

9. A moving object comprising the vibrating element according to claim 1.

10. A moving object comprising the vibrating element according to claim 2.

* * * * *